United States Patent
Zhou

(10) Patent No.: US 11,367,774 B2
(45) Date of Patent: Jun. 21, 2022

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/249,487

(22) Filed: Mar. 3, 2021

(65) Prior Publication Data
US 2021/0280669 A1    Sep. 9, 2021

(30) Foreign Application Priority Data
Mar. 5, 2020    (CN) .......................... 202010146491.6

(51) Int. Cl.
| | | |
|---|---|---|
| *H01L 23/528* | (2006.01) | |
| *H01L 23/522* | (2006.01) | |
| *H01L 23/552* | (2006.01) | |
| *H01L 49/02* | (2006.01) | |

(52) U.S. Cl.
CPC .......... *H01L 28/82* (2013.01); *H01L 23/5286* (2013.01); *H01L 23/552* (2013.01)

(58) Field of Classification Search
CPC ..... H01L 28/82; H01L 28/86; H01L 23/5225; H01L 23/5223; H01L 23/5286
See application file for complete search history.

(56) References Cited

U.S. PATENT DOCUMENTS

| | | | | |
|---|---|---|---|---|
| 2008/0129911 A1* | 6/2008 | Huang | .............. | G02F 1/136209 257/E27.113 |
| 2009/0097186 A1* | 4/2009 | Topaloglu | ............... | H01L 28/90 29/25.42 |
| 2010/0271750 A1* | 10/2010 | Chiu | ................... | H01L 23/5222 361/301.4 |

* cited by examiner

*Primary Examiner* — Omar F Mojaddedi
(74) *Attorney, Agent, or Firm* — Anova Law Group, PLLC

(57) ABSTRACT

A semiconductor structure and a fabrication method of the semiconductor structure are provided in the present disclosure. The semiconductor structure includes a substrate, where the substrate includes a shielding region having a first area; a first shielding layer on the substrate, where a first shielding structure is in the first shielding layer of the shielding region, and the first shielding structure has a first density; a second shielding layer on the first shielding layer, where a second shielding structure is in the second shielding layer of the shielding region, and the second shielding structure has a second density which is less than the first density; and an electrical interconnection structure, electrically interconnecting the first shielding structure with the second shielding structure and enabling the first shielding structure grounded.

20 Claims, 9 Drawing Sheets

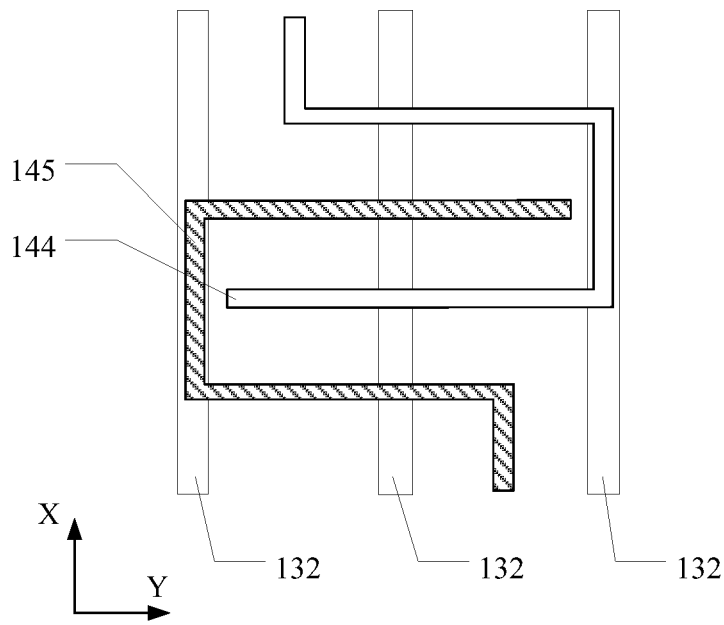

FIG. 13

| Providing a substrate, where the substrate includes a shielding region having a first area | S801 |

| Forming a first shielding layer on the substrate, where a first shielding structure is in the first shielding layer of the shielding region; a projection of the first shielding structure has a first projection on a surface of the substrate; and the first shielding structure has a first density, the first density being a ratio of an area of the first projection over the first area | S802 |

| Forming a second shielding layer on the first shielding layer, where a second shielding structure is in the second shielding layer of the shielding region; a projection of the second shielding structure has a second projection on the surface of the substrate; the second shielding structure has a second density which is less than the first density, the second density being a ratio of an area of the second projection over the first area | S803 |

| Forming an electrical interconnection structure, electrically interconnecting the first shielding structure with the second shielding structure and enabling the first shielding structure grounded | S804 |

FIG. 14

SEMICONDUCTOR STRUCTURE AND FORMATION METHOD THEREOF

CROSS-REFERENCE TO RELATED APPLICATION

This application claims the priority of Chinese Patent Application No. 202010146491.6, filed on Mar. 5, 2020, the content of which is incorporated herein by reference in its entirety.

TECHNICAL FIELD

The present disclosure generally relates to the field of semiconductor manufacturing and, more particularly, relates to a semiconductor structure and its fabrication method.

BACKGROUND

Capacitors, as an important component of integrated circuits, are widely used in memory chips, microwave chips, radio frequency chips, smart card chips, high voltage chips, filtering chips, and the like. A capacitor structure widely used in the chips is a metal-insulator-metal (MIM) capacitor in parallel with a silicon wafer substrate. The metal may be a material including copper, aluminum, and the like which may have a manufacturing process compatible with a metal interconnection process; and the insulator may be a dielectric material with a high dielectric constant such as silicon nitride, silicon oxide, and the like.

With continuous development and performance improvement of the semiconductor integrated circuit manufacturing technology, the device miniaturization and miniaturization process may also continue to evolve. More advanced manufacturing process may require the implementation of many devices as possible in the smallest possible region to obtain the highest possible performance. Metal-oxide-metal (MOM) capacitors have been widely used in the semiconductor device manufacturing due to their advantages, such as the implementation capability with copper interconnect structures, a relatively high capacitance density, and the like.

However, the performance of the capacitors in the existing technology still needs to be improved.

SUMMARY

One aspect of the present disclosure provides a semiconductor structure. The semiconductor structure includes a substrate, where the substrate includes a shielding region having a first area; a first shielding layer on the substrate, where a first shielding structure is in the first shielding layer of the shielding region; a projection of the first shielding structure has a first projection on a surface of the substrate; and the first shielding structure has a first density, the first density being a ratio of an area of the first projection over the first area; a second shielding layer on the first shielding layer, where a second shielding structure is in the second shielding layer of the shielding region; a projection of the second shielding structure has a second projection on the surface of the substrate; the second shielding structure has a second density which is less than the first density, the second density being a ratio of an area of the second projection over the first area; and an electrical interconnection structure, electrically interconnecting the first shielding structure with the second shielding structure and enabling the first shielding structure grounded.

Optionally, the second projection is within a range of the first projection.

Optionally, the first shielding structure includes a plurality of first strip structures which extends along a first direction and is in parallel with each other and, and a plurality of second strip structures which extends along a second direction and is connected to the plurality of first strip structures, where the first direction and the second direction are perpendicular to each other.

Optionally, a distance between adjacent first strip structures ranges from about 21 nanometers to about 120 nanometers; and a distance between adjacent second strip structures ranges from about 21 nanometers to about 120 nanometers.

Optionally, the second shielding structure includes a plurality of third strip structures extending along one or both of a first direction and a second direction, where the first direction and the second direction are perpendicular to each other.

Optionally, a distance between adjacent third strip structures which are in parallel with each other ranges from about 42 nanometers to about 240 nanometers.

Optionally, the first shielding structure is made of a material including a metal material.

Optionally, the second shielding structure is made of a material including a metal material.

Optionally, the electrical interconnection structure further includes a plurality of conductive plugs between the first shielding structure and the second shielding structure, where one end of a conductive plug of the plurality of conductive plugs is electrically interconnected with the first shielding structure, and another end of the conductive plug of the plurality of conductive plugs is electrically interconnected with the second shielding structure.

Optionally, the electrical interconnection structure includes a grounded metal structure surrounding the first shielding structure, where the grounded metal structure is electrically interconnected with the first shielding structure.

Optionally, the structure further includes a device layer on the second shielding layer, where the device layer in the shielding region contains a device structure.

Optionally, the device structure includes a capacitor structure.

Optionally, the capacitor structure includes a metal device layer and a dielectric layer; the metal device layer includes a first metal structure and a second metal structure which are adjacent to each other; and the dielectric layer is between the first metal structure and the second metal structure.

Optionally, the metal device layer has a third projection on the surface of the substrate; and along a direction perpendicular to the surface of the substrate, an overlapped area of the third projection and the first projection is greater than an overlapped area of the third projection and the second projection.

Optionally, the third projection is within a range of the first projection.

Optionally, a distance between a contour of the third projection and a contour of the first projection ranges from about 0.2 μm to about 2 μm.

Optionally, a first dielectric layer, surrounding the first shielding structure, is in the first shielding layer; and a second dielectric layer, surrounding the second shielding structure, is in the second shielding layer.

Optionally, the conductive plug is made of a metal material including tungsten, aluminum, copper, or a combination thereof.

Optionally, the first metal structure is used as a first electrode of the capacitor structure, and the second metal structure is used as a second electrode of the capacitor structure.

Another aspect of the present disclosure provides a method for fabricating a semiconductor structure. The method includes providing a substrate, where the substrate includes a shielding region having a first area; forming a first shielding layer on the substrate, where a first shielding structure is in the first shielding layer of the shielding region; a projection of the first shielding structure has a first projection on a surface of the substrate; and the first shielding structure has a first density, the first density being a ratio of an area of the first projection over the first area; forming a second shielding layer on the first shielding layer, where a second shielding structure is in the second shielding layer of the shielding region; a projection of the second shielding structure has a second projection on the surface of the substrate; the second shielding structure has a second density which is less than the first density, the second density being a ratio of an area of the second projection over the first area; and forming an electrical interconnection structure, electrically interconnecting the first shielding structure with the second shielding structure and enabling the first shielding structure grounded.

Compared with the existing technology, the technical solutions provided by the present disclosure may achieve at least the following beneficial effects.

In the semiconductor structure provided by the technical solutions of the present disclosure, the first density is greater than the second density; meanwhile, the electrical interconnection structure may enable the first shielding structure to be electrically interconnected to the second shielding structure and enable the first shielding structure to be grounded. Therefore, on the one hand, most noise from the substrate may be received by the first shielding structure with the high first density and transmitted to the outside of the semiconductor structure through the electrical interconnection structure, such that the influence of the noise from the substrate on the electrical device, especially the capacitor structure, on the second shielding layer of the shielding region may be reduced, thereby improving the performance of the electrical device, especially the capacitor structure. On the other hand, by disposing the second shielding structure between the first shielding structure and the electrical device, along the direction perpendicular to the surface of the substrate, not only the distance between the first shield structure and the electrical device may be increased to reduce the parasitic capacitance generated between the first shielding structure and the electrical device, especially between the first shielding structure and the capacitor structure, thereby improving the performance of the electrical device, especially the capacitor structure; but also the second shielding structure may be used to further reduce the noise from the substrate, thereby improve the performance of the electrical device, especially the capacitor structure. Meanwhile, since the second density is small, the parasitic capacitance between the second shielding structure and the electrical device, especially the capacitor structure, may be reduced, which may further improve the performance of the electrical device, especially the capacitor structure. Therefore, through the first shielding structure, the second shielding structure, and the electrical interconnection structure, the noise from the substrate may be greatly reduced, and the parasitic capacitance generated between the shielding structure and the electrical device, especially between the shielding structure and the capacitor structure, may also be reduced, which may improve the performance of the electrical device, especially the capacitor structure.

BRIEF DESCRIPTION OF THE DRAWINGS

The following drawings are merely examples for illustrative purposes according to various disclosed embodiments and are not intended to limit the scope of the present disclosure.

FIGS. 4-13 illustrate structural schematics corresponding to certain stages of a method for forming an exemplary semiconductor structure according to various disclosed embodiments of the present disclosure; and FIG. 14 illustrates a flowchart of an exemplary fabrication method for forming a semiconductor structure according to various disclosed embodiments of the present disclosure.

DETAILED DESCRIPTION

Reference will now be made in detail to exemplary embodiments of the disclosure which are illustrated in the accompanying drawings. Wherever possible, the same reference numbers will be used throughout the drawings to refer to the same or like parts.

A semiconductor structure and a fabrication method of the semiconductor structure are provided in the present disclosure. The semiconductor structure includes a substrate, where the substrate includes a shielding region having a first area; a first shielding layer on the substrate, where a first shielding structure is in the first shielding layer of the shielding region, and the first shielding structure has a first density; a second shielding layer on the first shielding layer, where a second shielding structure is in the second shielding layer of the shielding region, and the second shielding structure has a second density which is less than the first density; and an electrical interconnection structure, electrically interconnecting the first shielding structure with the second shielding structure and enabling the first shielding structure grounded.

Figure 1:
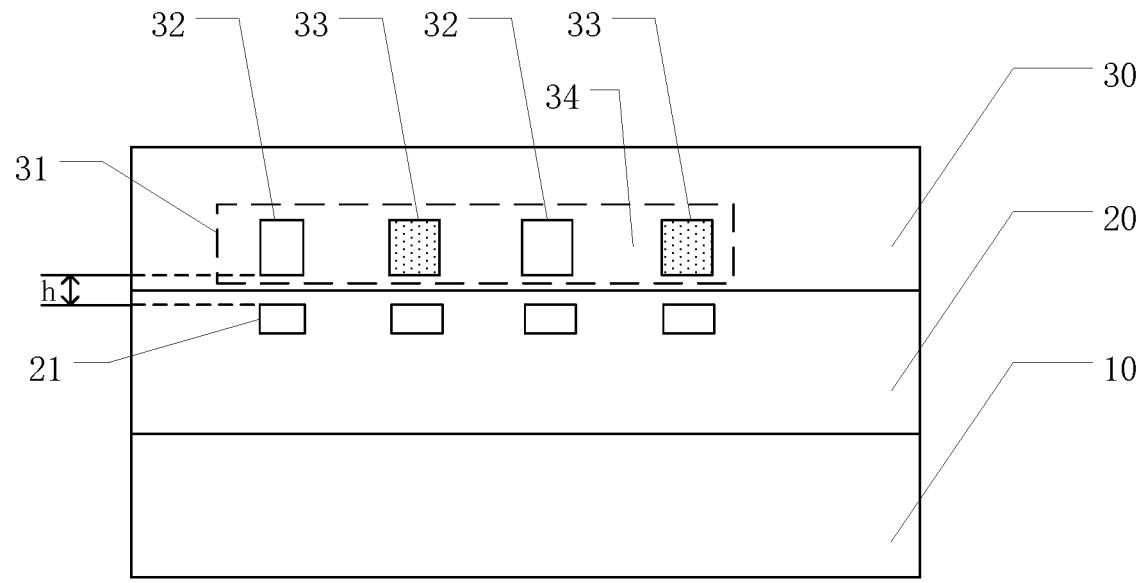
FIGS. 1-3 illustrate structural schematics of a semiconductor structure in the existing technology.
Figure 2:
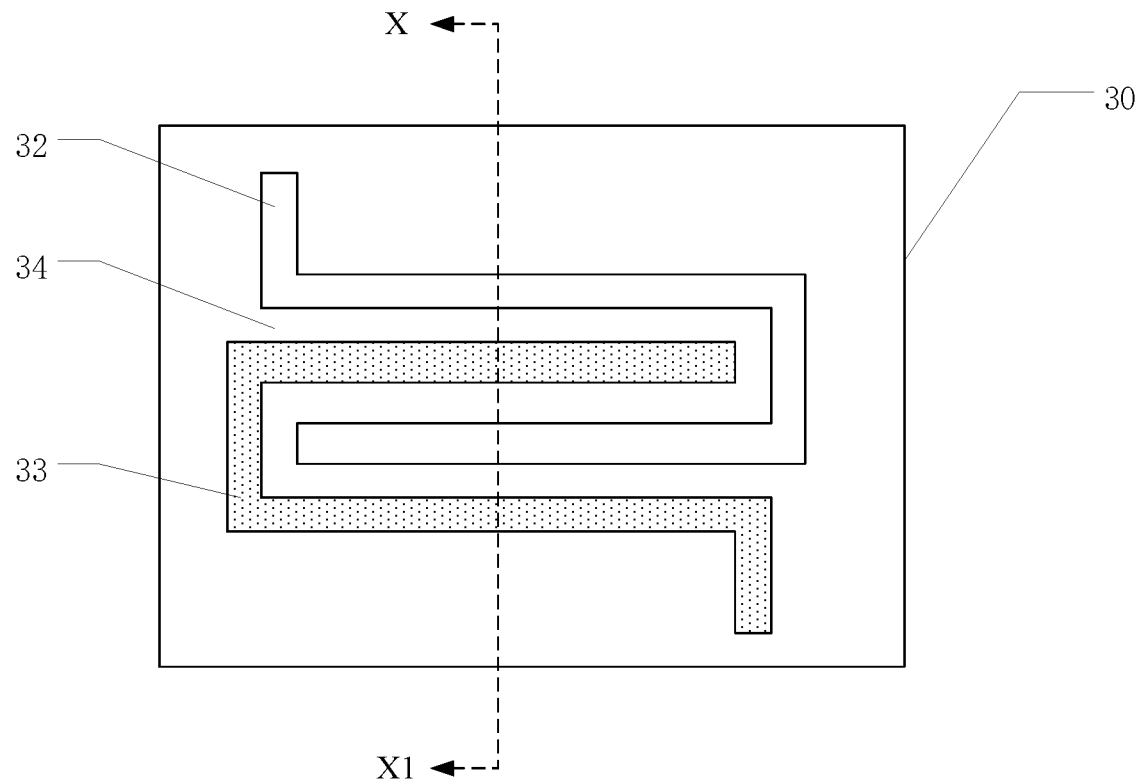
Figure 3:
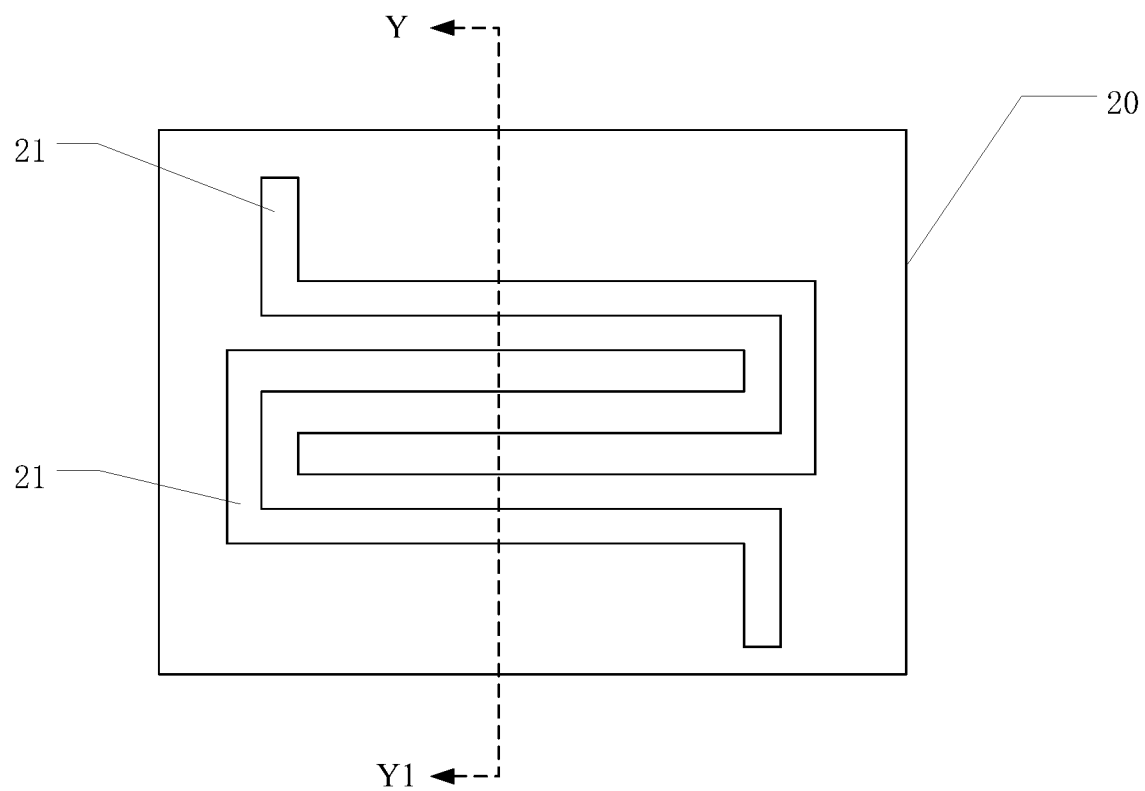

FIGS. 1-3 illustrate structural schematics of a semiconductor structure in the existing technology.

Referring to FIGS. 1-3, FIG. 1 illustrates a cross-sectional structural schematic of the semiconductor structure, FIG. 2 illustrates a top structural view of a metal-oxide metal capacitor in FIG. 1, and FIG. 3 illustrates a top structural view of a shielding structure in FIG. 1. In addition, FIG. 1 illustrates a cross-sectional structural schematic along a X-X1 direction in FIG. 2, and FIG. 1 illustrates a cross-sectional structural schematic along a Y-Y1 direction in FIG. 3. The semiconductor structure may include a substrate 10; a shielding layer 20 on the surface of the substrate 10, where a shielding structure 21 is in the shielding layer 20; and a device layer 30 on the surface of the shielding layer 20, where a capacitor structure 31 is in the device layer 30.

The capacitor structure 31 may include a first electrode layer 32 and a second electrode layer 33 which are adjacent to each other, and a dielectric layer 34 between the first electrode layer 32 and the second electrode layer 33. The first electrode layer 32 and the second electrode layer 33 may be in a same metal layer and have a first projection (not shown) on the surface of the substrate 10.

The shielding structure 21 may have a second projection (not shown) on the surface of the substrate 10. The first projection may be within the range of the second projection, that is, the shielding structure may completely cover the first electrode layer 32 and the second electrode layer 33.

The shielding structure 21 may be made of a metal material.

The semiconductor structure may further include a grounded metal structure (not shown) for grounding, and the grounded metal structure may be electrically interconnected with the shielding structure 21.

In the above-mentioned semiconductor structure, a part of the noise from the substrate 10 may be transmitted out of the semiconductor structure through the shielding structure 21 and the grounded metal structure. Moreover, in order to further reduce the influence of the noise of the substrate 10 on the capacitor structure 31, the shielding structure 21 may completely cover the first electrode layer 32 and the second electrode layer 33.

However, due to a small distance h between the shielding structure 21 and the capacitor structure 31 (as shown in FIG. 1), parasitic capacitance may be generated between the shielding structure 21 and each of the first electrode layer 32 and the second electrode layer 33; moreover, since the shielding structure 21 completely covers the first electrode layer 32 and the second electrode layer 33, that is, the overlapped portion between the shielding structure 21 and the first electrode layer 32 and the second electrode layer 3 is relatively large, the parasitic capacitance between the shielding structure 21 and each of the first electrode layer 32 and the second electrode layer 33 may increase, resulting a poor performance of the capacitor structure 31.

In order to solve the above-mentioned technical problem, the embodiments of the present disclosure provide a semiconductor structure. The semiconductor structure may include: a substrate, where the substrate includes a shielding region having a first area; a first shielding layer on the substrate, where a first shielding structure is in the first shielding layer of the shielding region; a projection of the first shielding structure has a first projection on a surface of the substrate; and the first shielding structure has a first density, the first density being a ratio of an area of the first projection over the first area; a second shielding layer on the first shielding layer, where a second shielding structure is in the second shielding layer of the shielding region; a projection of the second shielding structure has a second projection on the surface of the substrate; the second shielding structure has a second density which is less than the first density, the second density being a ratio of an area of the second projection over the first area; and an electrical interconnection structure, electrically interconnecting the first shielding structure with the second shielding structure and enabling the first shielding structure grounded, thereby improving the performance of the electrical device, especially the capacitor structure.

In order to clearly illustrate the above-mentioned objectives, features, and advantages of the present disclosure, various embodiments of the present disclosure are described in detail with reference to the accompanying drawings hereinafter.

FIGS. 4-13 illustrate structural schematics corresponding to certain stages of a method for forming an exemplary semiconductor structure according to various disclosed embodiments of the present disclosure.

Figure 4:
Figure 4:
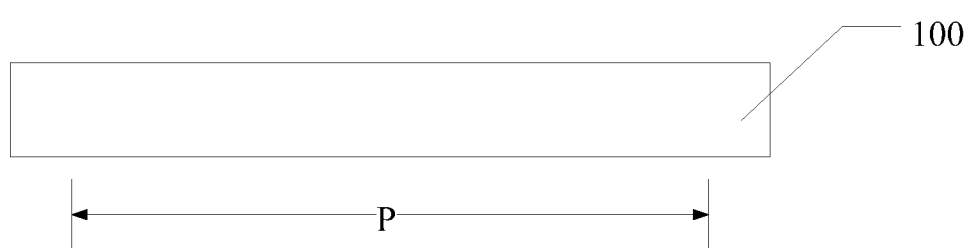
Figure 5:
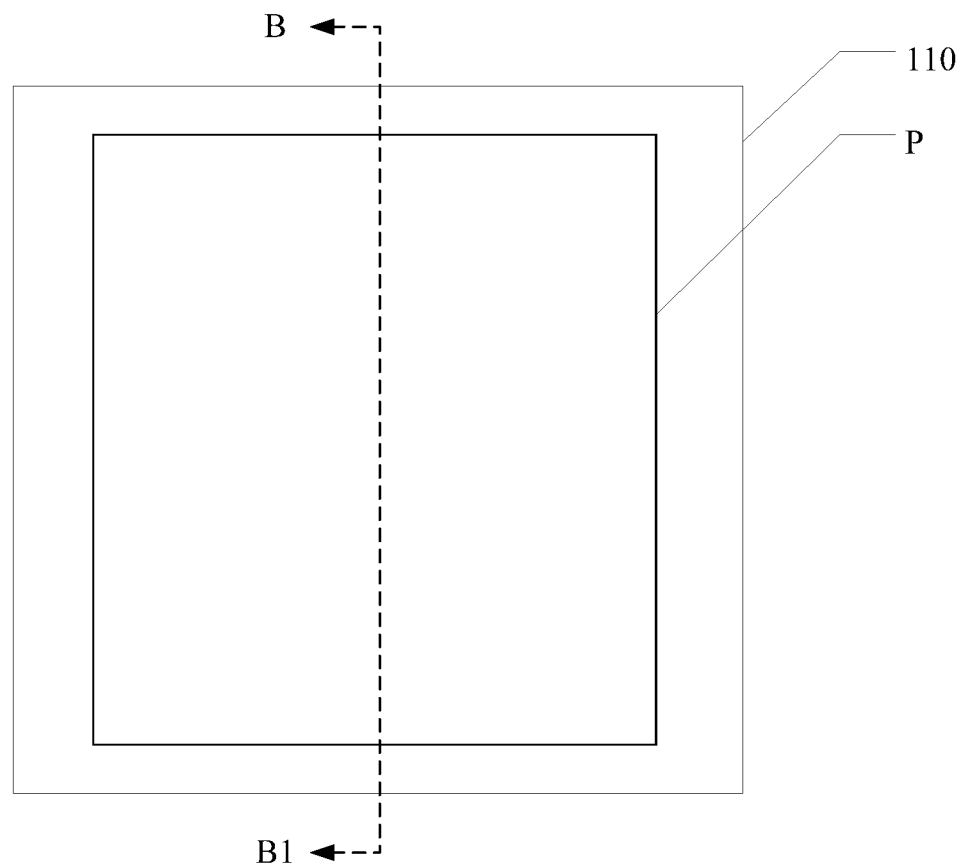

Referring to FIGS. 4-5, FIG. 4 illustrates a cross-sectional structural schematic along a direction B-B1 in FIG. 5, and FIG. 5 illustrates a top structural view along a direction A in FIG. 4. A substrate 100 may be provided, where the substrate 100 may include a shielding region P having a first area S1 (e.g., in S801 of FIG. 14).

The substrate 100 may be made of a semiconductor material.

In one embodiment, the substrate 100 may be made of silicon. In other embodiments, the substrate may be made of a material including silicon carbide, silicon germanium, a multi-element semiconductor material composed of group III-V elements, silicon-on-insulator (SOI), germanium-on-insulator, and/or any combination thereof. The multi-element semiconductor material composed of group III-V elements may include InP, GaAs, GaP, InAs, InSb, InGaAs, InGaAsP, and/or a combination thereof.

In one embodiment, the substrate 100 may further have a device layer (not shown). The device layer may include a device structure, for example, a PMOS (P-channel metal-oxide-semiconductor) transistor or an NMOS (N-channel metal-oxide-semiconductor) transistor. The device layer may further include an interconnection structure electrically connected to the device structure, and an insulation layer surrounding the device structure and the interconnection structure.

Figure 6:
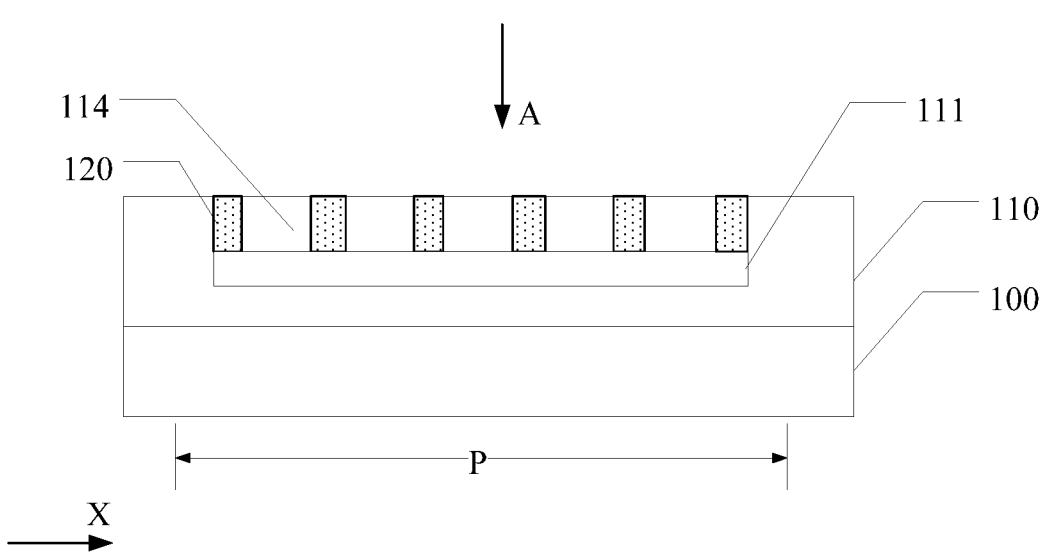
Figure 7:
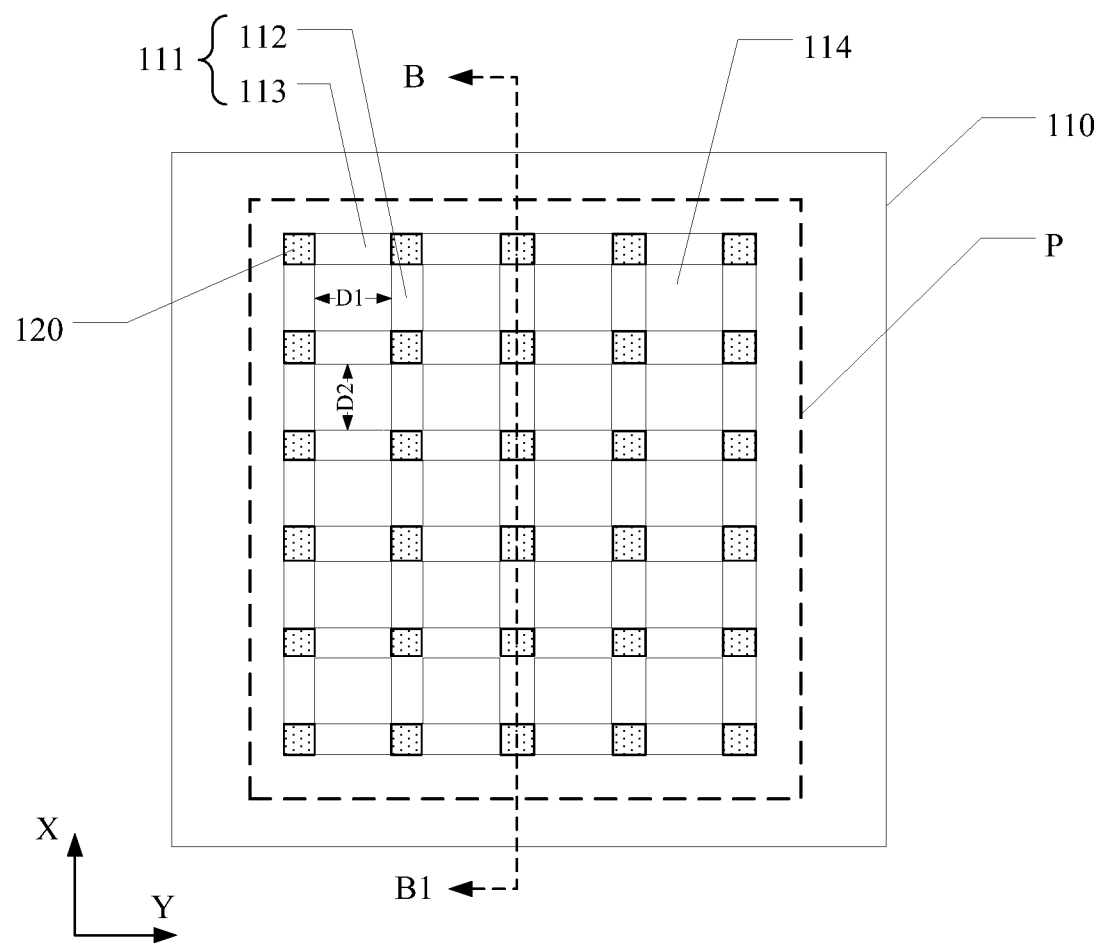

Referring to FIGS. 6-7, FIG. 6 illustrates a cross-sectional structural schematic along the direction B-B1 in FIG. 7, and FIG. 7 illustrates a top structural view along the direction A in FIG. 6. A first shielding layer 110 may be formed on the substrate 100; a first shielding structure 111 may be in the first shielding layer 110 of the shielding region P; the first shielding structure 111 may have a first density K1; the first density K1 may be the ratio of an area M1 of the first projection over the first area S1; and the first projection may be a projection of the first shielding structure 111 on the surface of the substrate 100 (e.g., in S802 of FIG. 14).

For example, the first density may have the following equation: $K1=M1/S1$.

It should be noted that, in order to facilitate the understanding of the relationship between the first projection and the first area, the position of the shielding area P is schematically illustrated by a dotted line in FIG. 7.

The first shielding structure 111 may be used to reduce the noise from the substrate, thereby reducing the influence of the noise on the semiconductor device formed on the shielding region P subsequently.

In one embodiment, the first shielding structure 111 may be made of a metal material, for example, tungsten, aluminum, copper, and/or any other suitable material(s).

In one embodiment, the first shielding structure 111 may include a plurality of first strip structures 112 which extends along a first direction X and is in parallel with each other, and a plurality of second strip structures 113 which extends along a second direction Y and is connected to the plurality of first strip structures 112, where the first direction X and the second direction Y are perpendicular to each other.

The first strip structures 112 and the second strip structures 113 may form into the first shielding structure 111 with a relatively high density, such that the influence of the noise from the substrate 100 on the semiconductor device, especially a capacitive device, subsequently formed on the shielding region P may be further reduced, thereby improving the performance of the semiconductor device, especially the capacitive device.

In other embodiments, the first shielding structure may be a honeycomb structure formed by a plurality of hexagonal strip structures.

In one embodiment, a distance D1 between adjacent first strip structures 112 may range from about 21 nanometers to about 120 nanometers; a distance D2 between adjacent second strip structures 113 may range from about 21 nanometers to about 120 nanometers.

In one embodiment, the first shielding layer 110 may further have a first dielectric layer 114 surrounding the first shielding structure 111.

In one embodiment, forming the first shield layer 110 may include: forming a first dielectric material layer (not shown) on the surface of the substrate 100; forming a first shielding material layer (not shown) on the surface of the first dielectric material layer; forming a first patterned layer (not shown) on the surface of the first shielding material layer, where the first patterned layer may cover a portion of the first shielding material layer on the shielding region P; using the first patterned layer as a mask, etching the first shielding material layer till the first dielectric material layer is exposed to form the first shielding structure 111; forming a second dielectric material layer (not shown) on the surface of the first dielectric material layer and the surface of the first shielding structure 111, where the first dielectric material layer and the second dielectric material layer may form the first dielectric layer 114.

In one embodiment, the first dielectric material layer and the second dielectric material layer may be formed by a process including a chemical vapor deposition process, an atomic layer deposition process, or a combination thereof.

In one embodiment, the first shielding material layer may be formed by a process including an atomic layer deposition process, a chemical vapor deposition process, an electroplating process, or a combination thereof.

In one embodiment, the first shielding material layer may be etched by a process including a dry etching process, a wet etching process, or a combination thereof.

In one embodiment, the method for forming the semiconductor structure may further include forming an electrical interconnection structure; and the electrical interconnection structure may enable the first shielding structure 111 to be electrically interconnected to a second shielding structure formed subsequently and enable the first shielding structure 111 to be grounded (e.g., in S804 of FIG. 14).

In one embodiment, the electrical interconnection structure may include the grounded metal structure (not shown) surrounding the first shielding structure 111. The grounded metal structure may be electrically interconnected with the first shielding structure 111.

Therefore, the noise, which is from the substrate 100 and transmitted to the first shielding structure 111, may be transmitted to the outside of the semiconductor structure through the grounded metal structure.

In one embodiment, the electrical interconnection structure may further include a plurality of conductive plugs 120 between the first shielding structure 111 and the second shielding structure formed subsequently. One end of the conductive plug 120 may be electrically interconnected with the first shielding structure 111, and another end of the conductive plug 120 may be electrically interconnected with the second shielding structure.

Therefore, through the conductive plugs 120, the noise, which is from the substrate 100 and transmitted to the second shielding structure, may be transmitted to the first shielding structure 111 and then transmitted to the outside of the semiconductor structure through the grounded metal structure.

Forming the conductive plugs 120 may include: after forming the first dielectric layer 114, forming a plurality of openings (not shown) in the first dielectric layer 114 on the first shielding structure 111, where the openings expose the surface of the first shielding structure 111; forming a conductive plug material layer (not shown) in the openings and on the surface of the first dielectric layer 114; and etching back the conductive plug material layer till the surface of the first dielectric layer 114 is exposed.

In one embodiment, the conductive plugs 120 may be made of a metal material, for example, tungsten, aluminum, copper, and/or any other suitable material(s).

Figure 8:
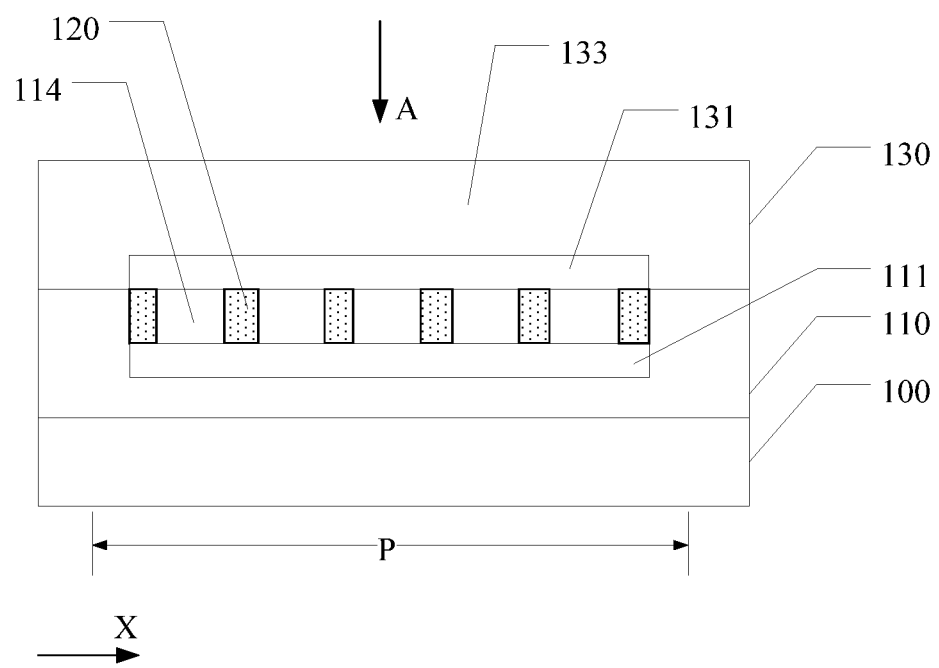
Figure 9:
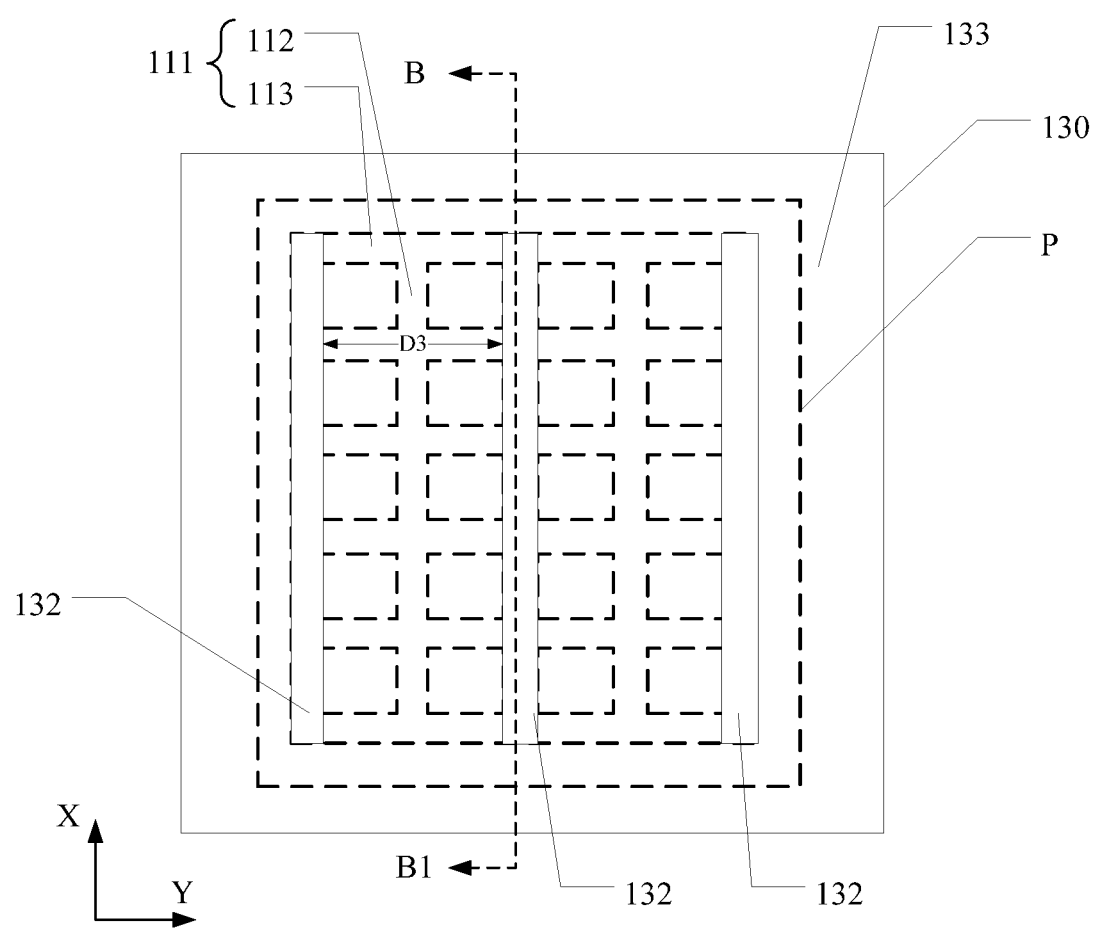

Referring to FIGS. 8-9, FIG. 8 illustrates a cross-sectional structural schematic along the direction B-B1 in FIG. 9, and FIG. 9 illustrates a top structural view along the direction A in FIG. 8. A second shielding layer 130 may be formed on the first shielding layer 110; a second shielding structure 131 may be in the second shielding layer 130 of the shielding region P; the second shielding structure 131 may have a second density K2; the second density K2 may be less than the first density K1; the second density K2 may be the ratio of an area M2 of a second projection to the first area S1; and the second projection may be a projection of the second shielding structure 131 on the surface of the substrate 100 (e.g., in S803 of FIG. 14).

For example, the second density may have the following equations: $K2=M2/S1$, and $K2<K1$.

It should be noted that, in order to facilitate the understanding of the relationship between the second projection and the first area, the position of the shielding area P is schematically illustrated by a dotted line in FIG. 9. Meanwhile, in order to facilitate understanding of the relationship between the first density K1 and the second density K2, the position of the first shielding structure 111 is also schematically illustrated by dotted lines in FIG. 9.

On the one hand, along the direction perpendicular to the surface of the substrate 100, the second shielding structure 131 is between an electrical device subsequently formed on the shielding region P and the first shielding structure 111, such that the distance between the first shielding structure 111 and the electrical device may be increased to reduce the parasitic capacitance between the first shielding structure 111 and the electrical device, especially between the first shielding structure 111 and the capacitor structure, thereby improving the performance of the electrical device, especially the capacitor structure. On the other hand, the second shielding structure 131 may be used to further reduce the noise from the substrate to improve the performance of the electrical device, especially the capacitor structure. Moreover, since the second density K2 is small, the parasitic capacitance between the second shielding structure 131 and the electrical device, especially the capacitor structure, may be reduced, thereby further improving the performance of the electrical device, especially the capacitor structure.

In one embodiment, the second shielding structure 131 may be made of a metal material, such as tungsten, aluminum, copper, and/or any other suitable material(s).

In one embodiment, the second projection may be within the range of the first projection.

In other embodiments, a portion of the second projection may be within the range of the first projection; and the other portion of the second projection may not be within the range of the first projection.

In one embodiment, the second shielding structure 131 may include a plurality of third strip structures 132 extending along the first direction X.

In another embodiment, the second shielding structure may include a plurality of third strip structures extending along the second direction.

In other embodiments, the second shielding structure may include a plurality of third strip structures. A part of the third strip structures may extend along the first direction, and another part of the third strip structures may extend along the second direction.

In one embodiment, a distance D3 between adjacent third strip structures 132 which are in parallel with each other may range from about 42 nanometers to about 240 nanometers.

In one embodiment, the second shielding layer 130 may further have a second dielectric layer 133 surrounding the second shielding structure 131.

In one embodiment, forming the second shield layer 130 may include forming a second shielding material layer (not shown) on the surface of the first dielectric layer 114 and the surface of the plurality of conductive plugs 120; forming a second patterned layer (not shown) on the surface of the second shielding material layer, where the second patterned layer may cover a portion of the second shielding material layer on the shielding region P; using the second patterned layer as a mask, etching the second shielding material layer till the first dielectric material layer is exposed to form the second shielding structure 131; and forming the second dielectric layer on the surface of the first dielectric layer 114 and the surface of the second shielding structure 131.

In one embodiment, the second shielding material layer may be formed by a process including an atomic layer deposition process, a chemical vapor deposition process, an electroplating process, or a combination thereof.

In one embodiment, the second shielding material layer may be etched by a process including a dry etching process, a wet etching process, or a combination thereof.

In one embodiment, the second dielectric layer 133 may be formed by a process including a chemical vapor deposition process, an atomic layer deposition process, or a combination thereof.

Figure 10:
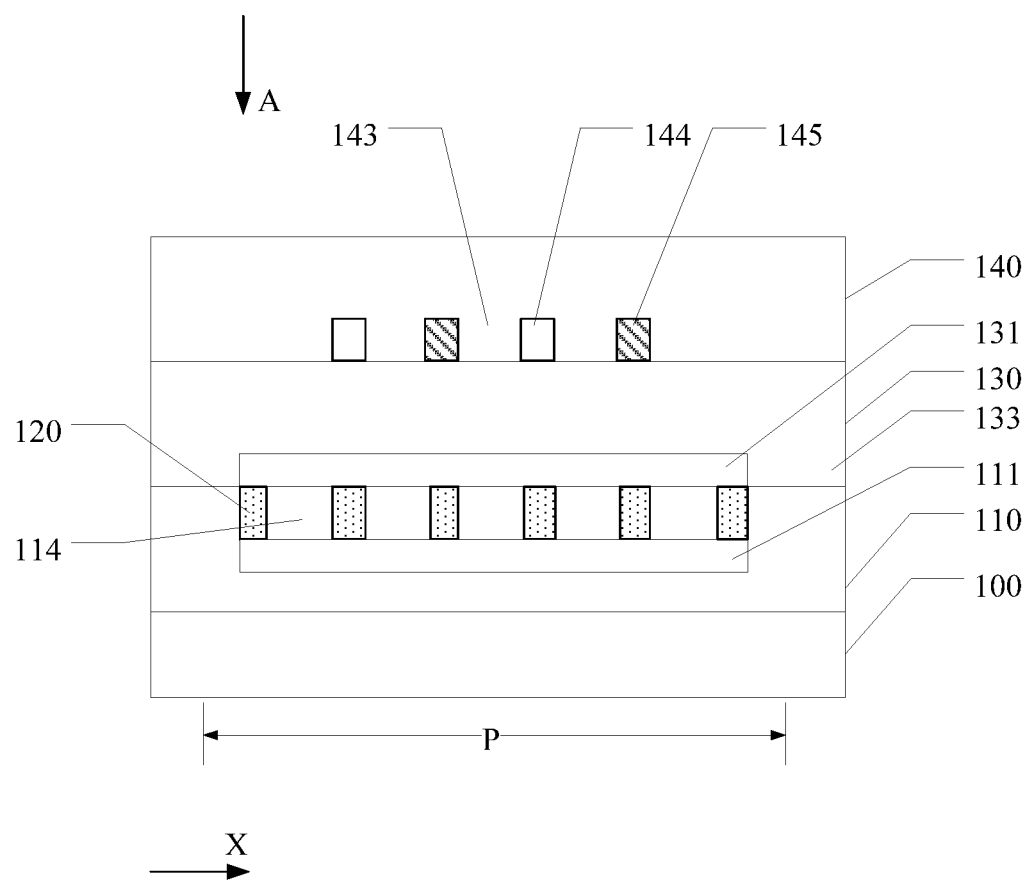
Figure 11:
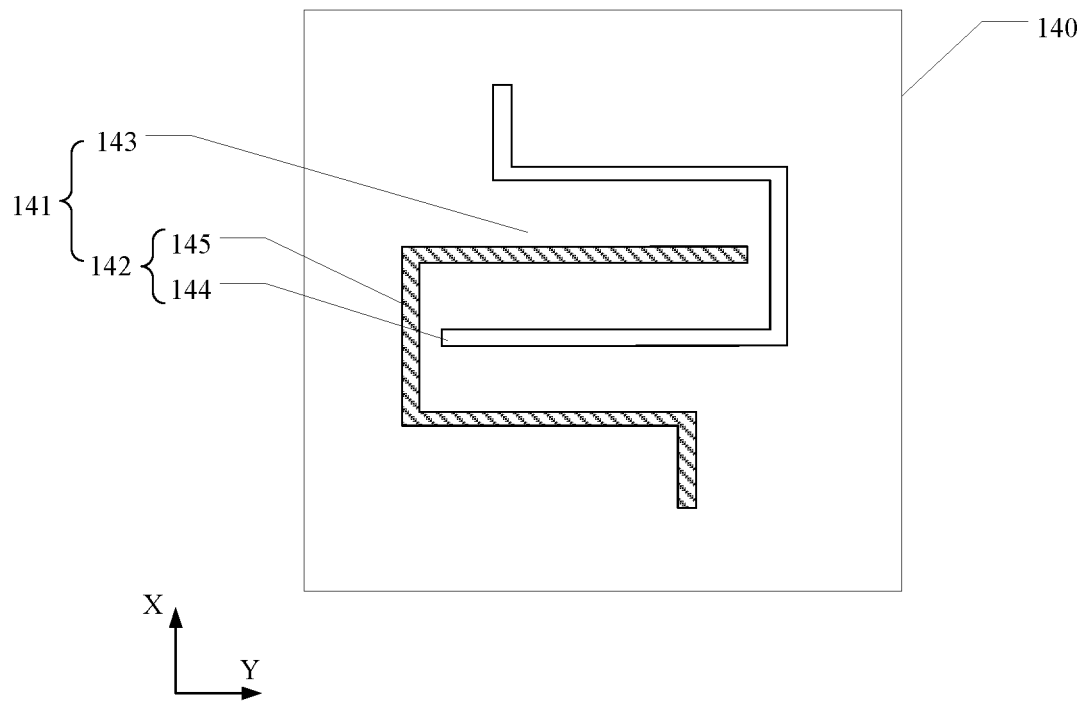
Figure 12:
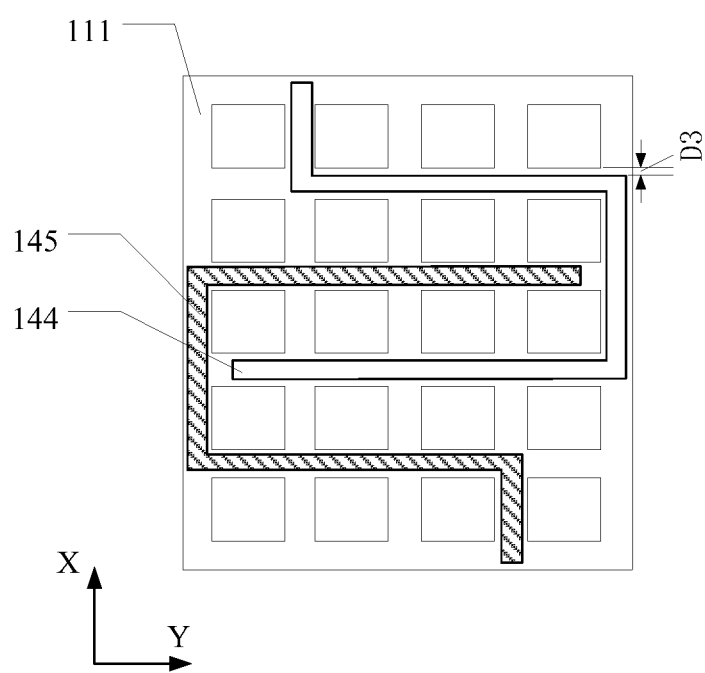

Referring to FIGS. 10-13. FIG. 10 illustrates a cross-sectional structural schematic along the direction B-B1 in FIG. 11; FIG. 11 illustrates a top structural view along the direction A in FIG. 10; FIG. 12 illustrates a top structural view of the first shielding structure overlapping a metal device layer in FIG. 10; and FIG. 13 illustrates a top structural view of the second shielding structure overlapping the metal device layer in FIG. 10. A device layer 140 may be on the second shielding layer 130, and the device layer 140 at the shielding region P may have a device structure.

In one embodiment, the device structure may include a capacitor structure 141.

In other embodiments, the device structure may further include an inductance structure.

In one embodiment, the capacitor structure 141 may include a metal device layer 142 and a dielectric layer 143; the metal device layer 142 may include a first metal structure 144 and a second metal structure 145 which are adjacent to each other; and the dielectric layer 143 may be between the first metal structure 144 and the second metal structure 145.

The first metal structure 144 may be used as a first electrode of the capacitor structure 141.

The second metal structure 145 may be used as a second electrode of the capacitor structure 141.

In one embodiment, a finger-interlaced structure may be formed between the first metal structure 144 and the second metal structure 145. In other embodiments, the first metal structure 144 and the second metal structure 145 may be adjacent strip structures and the like, which are capable of implementing the capacitor function.

In one embodiment, forming the capacitor structure 141 may include forming a metal device material layer (not shown) on the surface of the second shielding layer 130; forming a third patterned layer on the surface of the metal device material layer, where the third patterned layer covers a portion of the metal device material layer on the shielding region P; using the third patterned layer as a mask, etching the metal device material layer till the surface of the second shielding layer 130 is exposed to form the metal device layer 142; and forming the dielectric layer 143 on the surface of the metal device layer 142 and the surface of the second shielding layer 130.

In one embodiment, the metal device layer 142 may have a third projection on the surface of the substrate 100.

In one embodiment, a portion of the third projection may be within the range of the second projection; and along the direction perpendicular to the surface of the substrate 100, the overlapped area of the third projection and the first projection may be greater than the overlapped area of the third projection and the second projection.

Due to the overlapped area of the third projection and the second projection, the parasitic capacitance between the second shielding structure 131 and the metal device layer 142 may be reduced, thereby improving the performance of the capacitor structure 141.

In one embodiment, the third projection may be within the range of the first projection. Therefore, along the direction perpendicular to the surface of the substrate 100, the first shielding structure 111 may completely cover the metal device layer 142, thereby better shielding the noise transmitted from the substrate 100 to the metal device layer 142.

In one embodiment, the distance D3 between the contour of the third projection and the contour of the first projection may range from about 0.2 μm to about 2 μm. Therefore, on the one hand, even if there is an error in the semiconductor structure manufacturing, the first shielding structure 111 may completely cover the metal device layer 142; and on the other hand, it can further increase the effect of shielding the noise transmitted from the substrate 100 to the metal device layer 142.

It should be noted that, in order to facilitate understanding of the relationship between the first projection and the third projection, the first shielding structure 111 and the metal device layer 142 are schematically overlapped in FIG. 12. In order to facilitate understanding of the relationship between the second projection and the third projection, the second shielding structure 131 and the metal device layer 142 are schematically overlapped in FIG. 13.

Correspondingly, the embodiments of the present invention also provide a semiconductor structure formed by the above-mentioned fabrication method. Referring to FIGS. 10-13, the semiconductor structure may include the substrate 100, where the substrate 100 may include the shielding region P having the first area S1; the first shielding layer 110 formed on the substrate 100, where the first shielding structure 111 may be in the first shielding layer 110 of the shielding region P, the first shielding structure 111 may have the first density K1, the first density K1 may be the ratio of the area M1 of the first projection over the first area S1, and the first projection may be the projection of the first shielding structure 111 on the surface of the substrate 100; the second shielding layer 130 formed on the first shielding layer 110, where the second shielding structure 131 may be in the second shielding layer 130 of the shielding region P, the second shielding structure 131 may have the second density K2, the second density K2 may be less than the first density K1, the second density K2 may be the ratio of the area M2 of the second projection over the first area S1, and the second projection may be the projection of the second shielding structure 131 on the surface of the substrate 100; and the electrical interconnection structure, electrically interconnecting the first shielding structure 111 with the second shielding structure 131 and enabling the first shielding structure 111 to be grounded.

For example, the first density is defined as K1=M1/S1; and the second density is defined as K2=M2/S1, where K2<K1.

The first density K1 is greater than the second density K2; meanwhile, the electrical interconnection structure may enable the first shielding structure 111 to be electrically interconnected to the second shielding structure 131 and enable the first shielding structure 111 to be grounded. Therefore, on the one hand, most noise from the substrate 100 may be received by the first shielding structure 111 with the high first density K1 and transmitted to the outside of the semiconductor structure through the electrical interconnection structure, such that the influence of the noise from the substrate 100 on the electrical device, especially the capacitor structure, on the second shielding layer 131 of the shielding region P may be reduced, thereby improving the performance of the electrical device, especially the capacitor structure. On the other hand, by disposing the second shielding structure 131 between the first shielding structure 111 and the electrical device, along the direction perpendicular to the surface of the substrate 100, not only the distance between the first shield structure 111 and the electrical device may be increased to reduce the parasitic capacitance generated between the first shielding structure 111 and the electrical device, especially between the first shielding structure 111 and the capacitor structure, thereby improving the performance of the electrical device, especially the capacitor structure; but also the second shielding structure 131 may be used to further reduce the noise from the substrate 100, thereby improve the performance of the electrical device, especially the capacitor structure. Meanwhile, since the second density K2 is small, the parasitic capacitance between the second shielding structure 131 and the electrical device, especially the capacitor structure, may be reduced, which may further improve the performance of the electrical device, especially the capacitor structure. Therefore, through the first shielding structure 111, the second shielding structure 131, and the electrical interconnection structure, the noise from the substrate 100 may be greatly reduced, and the parasitic capacitance generated between the shielding structure and the electrical device, especially between the shielding structure and the capacitor structure, may also be reduced, which may improve the performance of the electrical device, especially the capacitor structure.

The substrate 100 may be made of a semiconductor material.

In one embodiment, the substrate 100 may be made of silicon. In other embodiments, the substrate may be made of a material including silicon carbide, silicon germanium, a multi-element semiconductor material composed of group III-V elements, silicon-on-insulator (SOI), germanium-on-insulator, and/or any combination thereof. The multi-element semiconductor material composed of group III-V elements may include InP, GaAs, GaP, InAs, InSb, InGaAs, InGaAsP, and/or a combination thereof.

In one embodiment, the substrate 100 may further have a device layer (not shown). The device layer may include a device structure, for example, a PMOS transistor or an NMOS transistor. The device layer may further include an interconnection structure electrically connected to the device structure, and an insulation layer surrounding the device structure and the interconnection structure.

In one embodiment, the first shielding structure 111 may be made of a metal material, for example, tungsten, aluminum, copper, and/or any other suitable material(s).

In one embodiment, the first shielding structure 111 may include the plurality of first strip structures 112 which extends along a first direction X and is in parallel with each other, and the plurality of second strip structures 113 which extends along a second direction Y and is connected to the plurality of first strip structures 112, where the first direction X and the second direction Y are perpendicular to each other.

The first strip structures 112 and the second strip structures 113 may form into the first shielding structure 111 with a relatively high density, such that the influence of the noise from the substrate 100 on the semiconductor device, especially the capacitive device, subsequently formed on the shielding region P may be further reduced, thereby improving the performance of the semiconductor devices, especially the capacitive device.

In other embodiments, the first shielding structure may be a honeycomb structure formed by a plurality of hexagonal strip structures.

In one embodiment, the distance D1 between adjacent first strip structures 112 may range from about 21 nanometers to about 120 nanometers; the distance D2 between adjacent second strip structures 113 may range from about 21 nanometers to about 120 nanometers. Since the quantities of the first strip structures 112 and the second strip structures 113 at the shielding region P is relatively large within the range of the distance D1 and the distance D2, the first density K1 is relatively large, which may greatly shield the noise from the substrate.

In one embodiment, the first shielding layer 110 may further have the first dielectric layer 114 surrounding the first shielding structure 111.

In one embodiment, the second shielding structure 131 may be made of a metal material, such as tungsten, aluminum, copper, and/or any other suitable material(s).

In one embodiment, the second projection may be within the range of the first projection.

In other embodiments, a portion of the second projection may be within the range of the first projection; and the other portion of the second projection may not be within the range of the first projection.

In one embodiment, the second shielding structure 131 may include the plurality of third strip structures 132 extending along the first direction X.

In another embodiment, the second shielding structure may include the plurality of third strip structures extending along the second direction.

In other embodiments, the second shielding structure may include the plurality of third strip structures. A part of third strip structures may extend along the first direction, and another part of third strip structures may extend along the second direction.

In one embodiment, the distance D3 between adjacent third strip structures 132 which are in parallel with each other may range from about 42 nanometers to about 240 nanometers. The quantity of third strip structures 132 in the shielding area P is small within the range of the distance D3, such that the parasitic capacitance generated between the second shielding structure 131 and the electrical device, especially the capacitor structure, may be reduced.

In one embodiment, the second shielding layer 130 may further have the second dielectric layer 133 surrounding the second shielding structure 131.

In one embodiment, the electrical interconnection structure may include the grounded metal structure (not shown) surrounding the first shielding structure 111. The grounded metal structure may be electrically interconnected with the first shielding structure 111.

Therefore, the noise, which is from the substrate 100 and transmitted to the first shielding structure 111, may be transmitted to the outside of the semiconductor structure through the grounded metal structure.

In one embodiment, the electrical interconnection structure may further include the plurality of conductive plugs 120 between the first shielding structure 111 and the second shielding structure formed subsequently. One end of the conductive plug 120 may be electrically interconnected with the first shielding structure 111, and another end of the conductive plug 120 may be electrically interconnected with the second shielding structure.

Therefore, through the conductive plugs 120, the noise, which is from the substrate 100 and transmitted to the second shielding structure, may be transmitted to the first shielding structure 111 and then transmitted to the outside of the semiconductor structure through the grounded metal structure.

In one embodiment, the conductive plug 120 may be made of a metal material, for example, tungsten, aluminum, copper, and/or any other suitable material(s).

In one embodiment, the semiconductor structure may further include the device layer 140 on the second shielding layer 130, where the device layer 140 at the shielding region P may have a device structure.

In one embodiment, the device structure may include the capacitor structure 141.

In other embodiments, the device structure may further include a inductance structure.

In one embodiment, the capacitor structure 141 may include the metal device layer 142 and the dielectric layer 143; the metal device layer 142 may include the first metal structure 144 and the second metal structure 145 adjacent to each other; and the dielectric layer 143 may be between the first metal structure 144 and the second metal structure 145.

The first metal structure 144 may be used as a first electrode of the capacitor structure 141.

The second metal structure 145 may be used as a second electrode of the capacitor structure 141.

In one embodiment, a finger-interlaced structure may be formed between the first metal structure 144 and the second metal structure 145. In other embodiments, the first metal structure 144 and the second metal structure 145 may be adjacent strip structures and the like, which are capable of realizing the capacitor function.

In one embodiment, the metal device layer 142 may have the third projection on the surface of the substrate 100.

In one embodiment, a portion of the third projection may be within the range of the second projection; and along the direction perpendicular to the surface of the substrate 100, the overlapped area of the third projection and the first projection may be greater than the overlapped area of the third projection and the second projection.

Due to the overlapped area of the third projection and the second projection, the parasitic capacitance between the second shielding structure 131 and the metal device layer 142 may be reduced, thereby improving the performance of the capacitor structure 141.

In one embodiment, the third projection may be within the range of the first projection. Therefore, along the direction perpendicular to the surface of the substrate 100, the first shielding structure 111 may completely cover the metal device layer 142, thereby better shielding the noise transmitted from the substrate 100 to the metal device layer 142.

In one embodiment, the distance D3 between the contour of the third projection and the contour of the first projection may range from 0.2 μm to 2 μm. Therefore, on the one hand, even if there is an error in the semiconductor structure manufacturing, the first shielding structure 111 may still completely cover the metal device layer 142; and on the other hand, it can further increase the effect of shielding the noise transmitted from the substrate 100 to the metal device layer 142.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A semiconductor structure, comprising:
   a substrate, wherein the substrate includes a shielding region having a first area;
   a first shielding layer on the substrate, wherein a first shielding structure is in the first shielding layer of the shielding region; a projection of the first shielding structure has a first projection on a surface of the substrate; and the first shielding structure has a first density, the first density being a ratio of an area of the first projection over the first area;
   a second shielding layer on the first shielding layer, wherein a second shielding structure is in the second shielding layer of the shielding region; a projection of the second shielding structure has a second projection on the surface of the substrate; the second shielding structure has a second density which is less than the first density, the second density being a ratio of an area of the second projection over the first area; and
   an electrical interconnection structure, electrically interconnecting the first shielding structure with the second shielding structure and enabling the first shielding structure grounded.

2. The structure according to claim 1, wherein:
   the second projection is within a range of the first projection.

3. The structure according to claim 1, wherein the first shielding structure includes:
   a plurality of first strip structures which extends along a first direction and is in parallel with each other and, and a plurality of second strip structures which extends along a second direction and is connected to the plurality of first strip structures, wherein the first direction and the second direction are perpendicular to each other.

4. The structure according to claim 3, wherein:
   a distance between adjacent first strip structures ranges from about 21 nanometers to about 120 nanometers; and a distance between adjacent second strip structures ranges from about 21 nanometers to about 120 nanometers.

5. The structure according to claim 1, wherein the second shielding structure includes:
   a plurality of third strip structures extending along one or both of a first direction and a second direction, wherein the first direction and the second direction are perpendicular to each other.

6. The structure according to claim 5, wherein:
   a distance between adjacent third strip structures which are in parallel with each other ranges from about 42 nanometers to about 240 nanometers.

7. The structure according to claim 1, wherein:
   the first shielding structure is made of a material including a metal material.

8. The structure according to claim 1, wherein:
the second shielding structure is made of a material including a metal material.

9. The structure according to claim 1, wherein the electrical interconnection structure further includes:
a plurality of conductive plugs between the first shielding structure and the second shielding structure, wherein one end of a conductive plug of the plurality of conductive plugs is electrically interconnected with the first shielding structure, and another end of the conductive plug of the plurality of conductive plugs is electrically interconnected with the second shielding structure.

10. The structure according to claim 1, wherein:
the electrical interconnection structure includes a grounded metal structure surrounding the first shielding structure, wherein the grounded metal structure is electrically interconnected with the first shielding structure.

11. The structure according to claim 1, further including:
a device layer on the second shielding layer, wherein the device layer in the shielding region contains a device structure.

12. The structure according to claim 11, wherein:
the device structure includes a capacitor structure.

13. The structure according to claim 12, wherein:
the capacitor structure includes a metal device layer and a dielectric layer; the metal device layer includes a first metal structure and a second metal structure which are adjacent to each other; and the dielectric layer is between the first metal structure and the second metal structure.

14. The structure according to claim 13, wherein:
the metal device layer has a third projection on the surface of the substrate; and along a direction perpendicular to the surface of the substrate, an overlapped area of the third projection and the first projection is greater than an overlapped area of the third projection and the second projection.

15. The structure according to claim 14, wherein:
the third projection is within a range of the first projection.

16. The structure according to claim 14, wherein:
a distance between a contour of the third projection and a contour of the first projection ranges from about 0.2 µm to about 2 µm.

17. The structure according to claim 1, wherein:
a first dielectric layer, surrounding the first shielding structure, is in the first shielding layer; and a second dielectric layer, surrounding the second shielding structure, is in the second shielding layer.

18. The structure according to claim 9, wherein:
the conductive plug is made of a metal material including tungsten, aluminum, copper, or a combination thereof.

19. The structure according to claim 13, wherein:
the first metal structure is used as a first electrode of the capacitor structure, and the second metal structure is used as a second electrode of the capacitor structure.

20. A method for fabricating a semiconductor structure, comprising:
providing a substrate, wherein the substrate includes a shielding region having a first area;
forming a first shielding layer on the substrate, wherein a first shielding structure is in the first shielding layer of the shielding region; a projection of the first shielding structure has a first projection on a surface of the substrate; and the first shielding structure has a first density, the first density being a ratio of an area of the first projection over the first area;
forming a second shielding layer on the first shielding layer, wherein a second shielding structure is in the second shielding layer of the shielding region; a projection of the second shielding structure has a second projection on the surface of the substrate; the second shielding structure has a second density which is less than the first density, the second density being a ratio of an area of the second projection over the first area; and
forming an electrical interconnection structure, electrically interconnecting the first shielding structure with the second shielding structure and enabling the first shielding structure grounded.

* * * * *